United States Patent [19]

Takenaka

[11] Patent Number: 5,084,248
[45] Date of Patent: Jan. 28, 1992

[54] APPARATUS FOR GROWING A COMPOUND SEMICONDUCTOR CRYSTAL

[75] Inventor: Chisato Takenaka, Atsugi, Japan

[73] Assignee: Fujitsu Limited, Kawasaki, Japan

[21] Appl. No.: 369,879

[22] Filed: Jun. 22, 1989

[30] Foreign Application Priority Data

Jun. 24, 1988 [JP] Japan .................... 63-156572

[51] Int. Cl.⁵ .......................................... C30B 15/02
[52] U.S. Cl. .................................. 422/249; 422/245;
422/248; 156/617.1; 156/618.1; 156/620.2;
156/DIG. 70
[58] Field of Search ............. 156/617.1, 618.1, 620.2,
156/DIG. 70, 602; 422/245, 246, 248, 249

[56] References Cited

U.S. PATENT DOCUMENTS

| | | | |
|---|---|---|---|
| 2,842,467 | 7/1958 | Landauer et al. | 156/602 |
| 3,600,294 | 8/1971 | Rubin et al. | 156/602 |
| 4,496,424 | 1/1985 | Terashima et al. | 156/DIG. 70 |
| 4,620,897 | 11/1986 | Nakajima | 156/602 |

*Primary Examiner*—Robert Kunemund
*Attorney, Agent, or Firm*—Armstrong, Nikaido, Marmelstein, Kubovcik & Murray

[57] ABSTRACT

An apparatus for growing a compound semiconductor crystal from a melt containing a plurality of component elements includes a crucible for accommodating the melt. A holding rod holds a seed crystal on which the compound semiconductor crystal is epitaxially grown such that the seed crystal makes contact with the melt. A first electrode is provided in contact with the melt in a vicinity of the seed crystal. A second electrode is provided in contact with the melt such that the second electrode is separated from the first electrode. A current source is connected across the first and second electrodes for flowing a direct current from the first electrode to the second electrode along a current path extending through the melt from the first electrode to the second electrode. A semiconductor piece of a semiconductor material contains elements which are included in the plurality of component elements forming the melt such that the semiconductor piece is provided in contact with the melt at a position between the first and second electrodes.

12 Claims, 7 Drawing Sheets

FIG. 5(A)
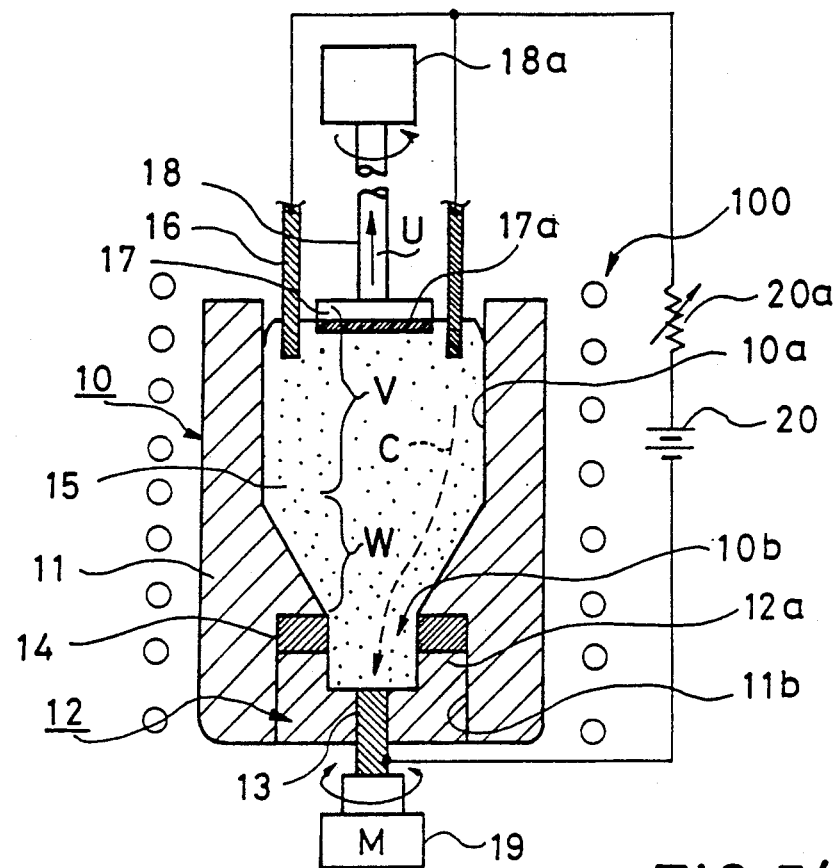
FIG.5(B)
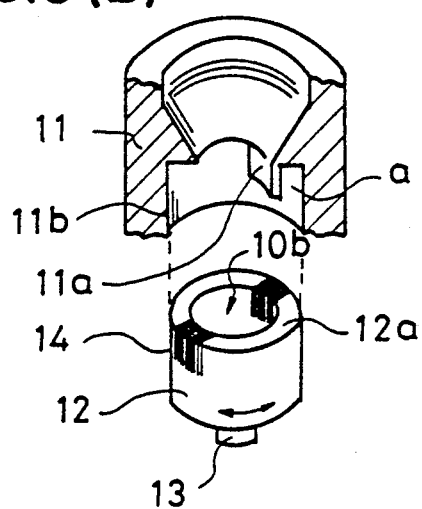
FIG.5(C)
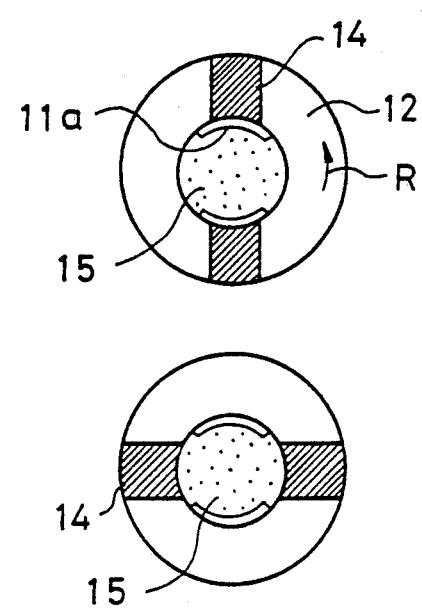
FIG.5(D)

APPARATUS FOR GROWING A COMPOUND SEMICONDUCTOR CRYSTAL

BACKGROUND OF THE INVENTION

The present invention generally relates an apparatus for growing semiconductor crystals and more particularly to an apparatus for growing a multi-component compound semiconductor crystal.

Compound semiconductor crystals such as gallium arsenide (GaAs) or indium phosphorus (InP) are used in various laser diodes for telecommunication purposes and the like because of their characteristic band structure which facilitates the emission of light by direct transition. It should be noted that, in laser diodes, the oscillation wavelength is determined by the band gap which is pertinent to the material of the compound semiconductor forming the active layer of the laser diode. Thus, the wavelength of the light that the laser diode produces is generally fixed. However, in the field of telecommunication in particular, there arises rather frequently a case in which other wavelengths are desirable. In order to design the laser diode which can oscillate at such a desired wavelength, one has to choose the material for the active layer so that the material has a proper band gap and the desired oscillation wavelength.

In choosing the compound semiconductor material, one has to keep in mind that the material should have a proper matching of the lattice constant with respect to the substrate. When mismatching occurs, mechanical stress develops which eventually deteriorates the operation of the semiconductor laser or ultimately destroys the structure of the laser diode. In order to solve this problem, use of a buffer layer or a graded layer structure has been proposed so as to relax the stress as much as possible. However, such a solution is complex and a provides only a limited success.

One possible solution to this problem is the use of multicomponent compound semiconductor material having three or more components for the substrate. When using GaAs or InP for the substrate, there is no degree of freedom in choosing the composition of the substrate since the composition of these materials is determined by the stoichiometry of Ga and As or In and P. On the other hand, when one uses a ternary compound semiconductor material such as (Ga, In)As, one can continuously change the composition of the substrate by changing the ratio of Ga and In. Thus, by choosing the composition such that the lattice constant of the substrate substantially matches with that of the active layer, one can eliminate all the complexity pertinent to the device which combines the desired compound semiconductor with the binary compound semiconductor substrate. In order to realize such a device, however, one has to establish a technique to grow a bulk crystal of the compound semiconductor material having three or more components.

Such a multi-component compound semiconductor crystal is grown from a melt of a compound semiconductor material during an epitaxial phase. FIG. 1 shows a prior art apparatus used for growing a ternary compound semiconductor crystal having a composition of $In_{0.53}Ga_{0.47}As$ from a melt. Referring to the drawing, a melt 1 of indium gallium arsenide (InGaAs) having a composition of In:Ga:As=0.790:0.040:0.170 in mole ratio (represented hereinafter as $In_{0.790}Ga_{0.040}As_{0.170}$) for example, is loaded in a crucible 2 and maintained at a temperature of 840° C. The melt 1 is then cooled to 780° C. Responsive to the cooling, an InGaAs crystal 3 having the desired composition of $In_{0.53}Ga_{0.47}As$ is grown on a substrate or seed crystal 4 at a tip of a rod 5.

In such a primitive method of growing, there is a problem in that the composition of the melt 1 is changed with time as illustrated in FIG. 2. Referring to the drawing, the composition of the melt 1 in equilibrium with the crystal 3 having the aforementioned composition at the beginning of the crystalization is represented by a point A. Upon cooling, the crystal 3 grows while maintaining equilibrium with the melt 1. When the melt 1 and the crystal 3 are in equilibrium, gallium (Ga) is preferentially incorporated into the crystal 3 as compared with indium (In) because of the non-uniform partitioning of elements between the melt and the crystal. Thus, there appears a depletion of Ga in the melt 1 as well as a depletion of arsenic (As) which is crystalized together with Ga. With further growth of the crystal, this depletion of Ga and As in the melt 1 becomes conspicuous. Further, the partition coefficient itself is also changed with temperature.

FIG. 2 shows an example of the compositional change of the melt 1 upon cooling. In the drawing, a tie line I shows an ideal path of the compositional change in which the composition of the crystal 3 in equilibrium with the melt 1 is maintained at $In_{0.53}Ga_{0.47}As$ during the growth. Further, the actual path of the composition of the melt 1 is represented by another tie line I' represented by a broken line. It can be seen that the composition of the melt 1 is deviated significantly from the ideal tie line I as a result of the concentration of Ga in the crystal 3 which causes t he depletion of Ga in the melt 1. When such a depletion of Ga occurs in the melt, the composition of the crystal grown from the melt is changed continuously while it is growing. In the final stage of crystalization, the InGaAs crystal can even have a composition of $In_{0.7}Ga_{0.3}As$. In other words, there appears a compositional inhomogeneity in the obtained InGaAs crystal 3. Such an inhomogenous crystal cannot be used for the substrate of the semiconductor devices.

In order to compensate such a depletion of Ga in the melt, Japanese Laid-open Patent Application NO. 62-18706 describes an apparatus shown in FIG. 3. In FIG. 3, these parts corresponding to those parts in FIG. 1 are given identical reference numerals and the description thereof will be omitted.

Referring to FIG. 3, the crucible 2 comprises a side wall portion 2a made of carbon so as to act as an electrode and a bottom part 2b made of boron nitride. Further, there is provided a source compound chip 6 of gallium arsenide (GaAs) embedded in the bottom part 2b. Furthermore, there is provided a carbon electrode 7 behind the source compound chip 6 and a d.c. voltage from a voltage source 8 is applied across the side wall 2a and the electrode 7 such that a current i flows from the side wall 2a to the electrode 7 through the melt 1 as well as through the source compound chip 6 as indicated by a broken line. In this construction, the current i passing through the source compound chip 6 produces a Joule heat which causes a local heating of the chip 6. At the same time, the current causes Peltier heating at a surface 6a of the source compound chip 6 in contact with the melt 1. In one example, a current with a density of about 16 A/cm² is flowed through the melt 1. As a result, Ga and As in the source compound chip 6 is dissolved into the melt 1 and the compensation to the depletion of Ga and As in the melt 1 is achieved. Further, Ga and As thus dissolved into the melt 1 is transported to the crystal 3 at the tip of the rod 5 by electromigration along a reversed path of the current.

This prior art apparatus, however, has a problem in that the supply of Ga and As to the melt 1 tends to become unstable as the current flows through the source compound chip 6 itself which is gradually dissolved into the melt 1. More specifically, there is a tendency that a number of minute projections and depressions are formed on the surface 6a as schematically shown in FIG. 3 in correspondence to the local path of the electrical current in the chip 6. Such projections and depressions enhances the concentration of current and the state of the surface 6a is changed continuously over time. As a result, the current flowing across the electrode 2a and the electrode 7 fluctuates over time which is difficult to control even with an elaborate control system. Thus, there appears a fluctuation in the supply of Ga and As to the melt 1 which results in the compositional inhomogeneity in the obtained crystal 3. Further, this prior art apparatus has another problem of unstable electromigration of Ga and As because of the unstable electrical current.

FIG. 4 shows another prior art apparatus. In the drawing, these parts corresponding to those parts in FIG. 1 are given identical reference numerals and the description thereof will be omitted.

Referring to FIG. 4, the crystal 3 of InGaAs is held on a carbon electrode plate 3a at the top of the crucible 2 so as to be in contact with the melt 1. Further, the source compound chip 6 is held in a carbon holder 7a and the d.c. voltage source 8 is connected across the electrode plate 3a and the carbon holder 7a. In this construction, the current flowing through the melt 1 causes Peltier cooling at a surface 3b of the crystal 3 and the growth of the crystal is controlled by the current causing the Peltier cooling. Responsive to the growth of the crystal 3, there appears the depletion of Ga in the melt 1 particularly in the vicinity of the crystal 3. This depletion of Ga in the melt is compensated by the source compound chip 6 which releases Ga and As to the melt 1. Thus, Ga and As dissolved into the melt 1 is transported to the vicinity of the crystal 3 mainly by diffusion. It should be noted that the electromigration does not contribute significantly to the transport of these dissolved species as the current path avoids the source compound chip 6. However, such a diffusion is not an efficient process for supplying the depleted Ga and As to the melt 1 in the vicinity of the crystal 3 and there is a tendency that the composition of the crystal 3 is deviated from the ideal composition. Further, as the current i passes through the crystal 3 itself, the surface 3b of the crystal 3 tends to become rough and there appears the fluctuation of the current i similarly to the case of the apparatus of FIG. 1. Such a fluctuation of the current i causes fluctuation in the Peltier cooling at the surface 3b which in turn invites inhomogenous growth and compositional inhomogeneity of the obtained crystal 3. It is of course possible to facilitate the transport of Ga and As from the source compound chip 6 to the part of the melt 1 surrounding the crystal 3 by designing the holder 7a such that current passes through the source compound chip 6 directly and Ga and As dissolved into the melt 1 is transported by the electromigration. However, such a construction inevitably causes unstable flow of the electrical current which in turn invites the unstable supply of Ga and As as already described with reference to the apparatus of FIG. 3.

SUMMARY OF THE INVENTION

Accordingly, it is a general object of the present invention to provide a novel and useful apparatus for growing a compound semiconductor crystal from a melt wherein the aforementioned problems are eliminated.

Another and more specific object of the present invention is to provide an apparatus for growing a compound semiconductor crystal from a melt while maintaining a desired composition of the compound semiconductor crystal.

Another object of the present invention is to provide an apparatus for growing a compound semiconductor crystal from a melt while supplying depleted species to the melt so as to compensate depletion of the species in the melt by dissolving a source compound containing the species, wherein the transport of the species dissolved into the melt from the source compound to a part of the melt surrounding the compound semiconductor crystal to be grown is performed stably by electromigration.

Another object of the present invention is to provide an apparatus for growing a compound semiconductor crystal from a melt while compensating the offset of composition of the melt by supplying depleted species to the melt from a source compound chip, comprising a first electrode provided in contact with the melt so as to surround the crystal at one side of a crucible containing the melt and a second electrode at the other side of the crucible also in contact with the melt, wherein the source compound chip is provided in contact with the melt so as to surround a current path extending from the first electrode to the second electrode. According to the present invention, the species dissolved into the melt from the source compound chip is immediately transported towards the crystal at a first side of the crucible by electromigration and the depletion of the species occuring in the melt as a result of the growth of the crystal is compensated efficiently. More specifically, the concentration of the species is kept low in a part of the melt in contact with the chip as a result of the continuous removal by the electromigration. With increased current density in the current path, the rate of removal of the species is increased and the rate of dissolution of the source compound chip is increased. Responsive thereto, the concentration of the species in the melt surrounding the crystal is increased. With decreased current density, on the other hand, the rate of removal of the species is decreased which results in a decrease in the concentration of the species in the melt surrounding the crystal. Thus, the composition of the melt particularly for those part surrounding the crystal is simply controlled by changing the current density of the current passing through the melt. Further, as the current does not pass any of the crystal or the source compound chip, there appears no Joule heating or Peltier heating/cooling in the vicinity of the crystal or the source compound chip. Thus, the control of the composition of the melt is greatly simplified. Further, the irregularity in the electrical current flowing through the melt which is pertinent to the prior art apparatus due to the passage of the electrical current through the crystal or the source compound chip is successfully eliminated by passing the current between the first and second electrode means. As a result, the compositional fluctuation of the crystal in equilibrium with the melt is easily eliminated.

Other objects and further features of the present invention will become apparent from the following detailed description when read in conjunction with the attached drawings.

BRIEF DESCRIPTION OF THE DRAWINGS

FIGS. 5(A)-(D) are diagrams showing a first embodiment of the apparatus for growing a compound semiconductor crystal according to the present invention;

DETAILED DESCRIPTION

Figure 1:
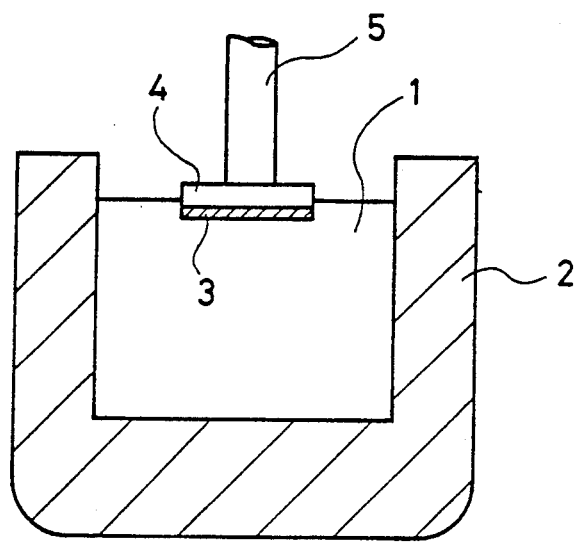
FIG. 1 is a diagram showing schematically a typical prior art apparatus used for growing a compound semiconductor crystal.
Figure 2:
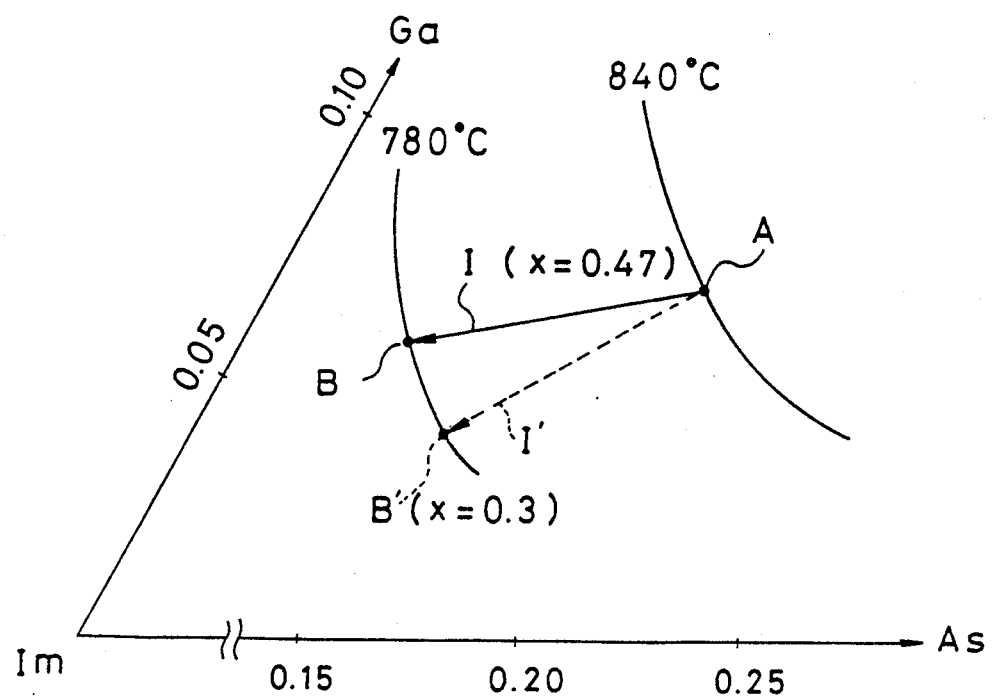
FIG. 2 is a phase diagram for explaining offset of the melt composition which occurs in the apparatus of FIG. 1.
Figure 3:
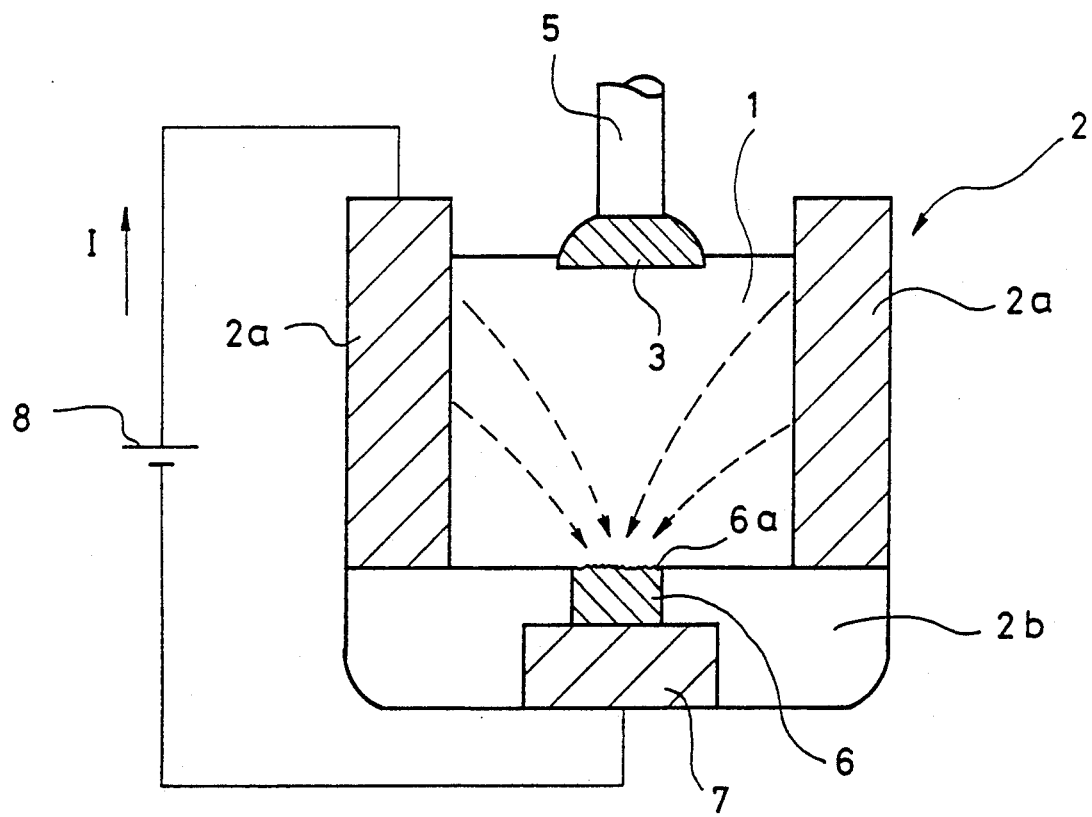
FIG. 3 is a diagram showing another prior art apparatus for solving the problem of the offset of the melt composition.
Figure 4:
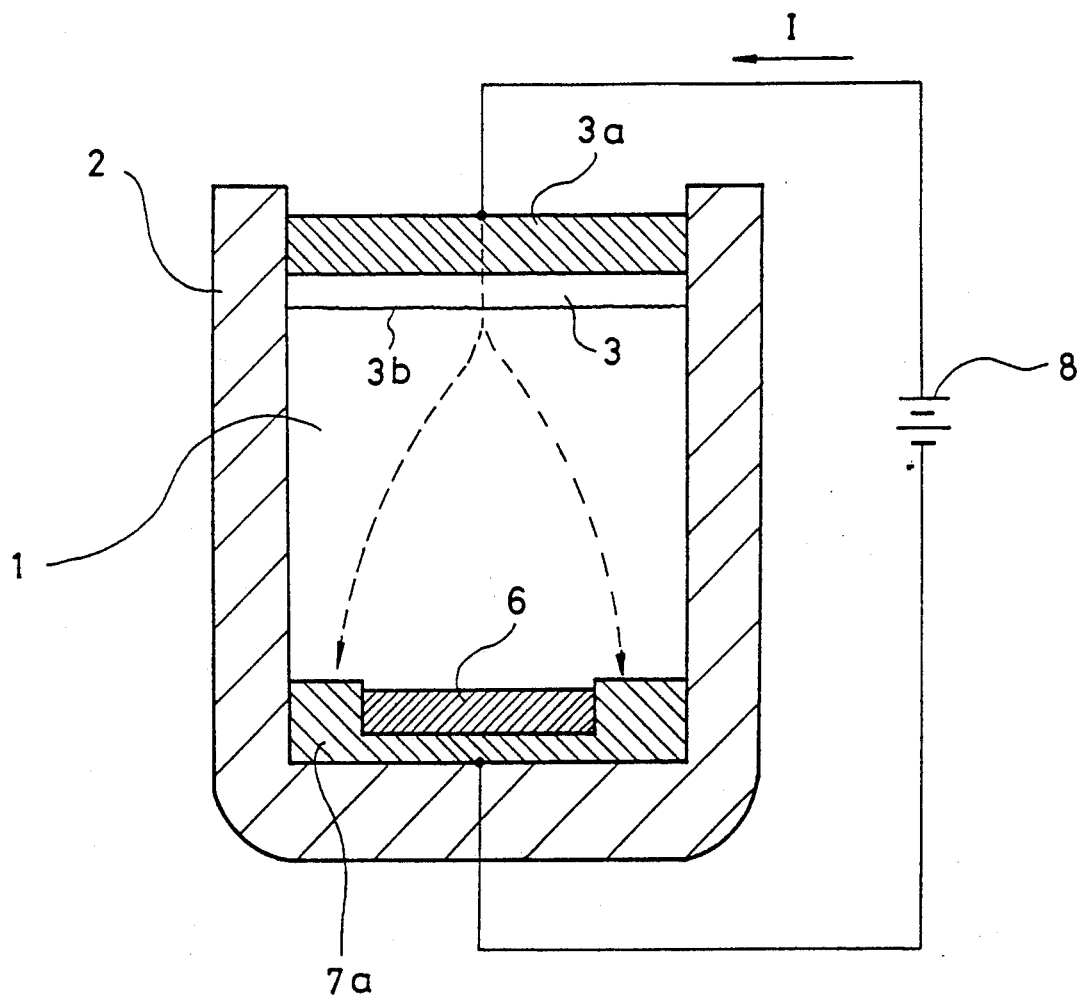
FIG. 4 is a diagram showing still other prior art apparatus.

FIG. 5(A) shows a first embodiment of the apparatus for growing a multi-component compound semiconductor crystal such as InGaAs from a melt in accordance with the present invention in a vertical cross section.

Referring to the drawing, the apparatus comprises a crucible 10 placed in a furnace 100. The crucible 10 comprises a crucible body 11 of boron nitride defined with an inner space 10a for accommodating a melt 15 of the multi-component compound semiconductor and a bottom plug 12 for closing the crucible body 11 at its bottom. The inner space 10a is divided into an upper part V having a generally cylindrical shape and a bottom part W having a funnel shape which reduces its diameter towards the bottom of the crucible 10. Further, there is provided a seed crystal or substrate 17 of the multi-component compound semiconductor crystal carried at a tip of a rod 18 so as to make a contact with the melt 15 from a top direction. The rod 18 is connected to a drive mechanism 18a which rotates the rod 18, and the rod is moved up and down responsive thereto. Furthermore, a pair of carbon electrodes 16 are provided around the seed crystal 17 so as to make a contact with the melt 15.

The bottom plug 12 is made of boron nitride and is inserted into a bottom of the crucible body 11 such that the plug 12 makes close contact with the crucible body 11 at a boundary 11b. Further, the bottom plug 12 is formed with an inner space 10b in continuation with the inner space 10a of the crucible body 11 for accommodating the melt 15. A solid carbon rod 13 is fixedly inserted into the plug 12 so as to make contact with the melt 15 in the crucible 10 at the bottom of the space 10b. Further, the carbon rod 13 projects downwards from the plug 12 and is connected to a motor or other suitable means 19 which rotates the plug 12 about the carbon rod 13 for a limited angle as will be described. In order to secure smooth movement of the plug 12 relative to the crucible body 11 and at the same time to prevent leakage of the melt 15 from the crucible 10, a side wall of the crucible body 11 and a corresponding side wall of the plug 12 in contact to each other along the boundary 11b are finished with high precision to a grade of specular finishing. As the material used for the crucible body 11 and the plug 12 is boron nitride which shows an extraordinary low friction, such close contact of the plug 12 and body 11 usually does not cause difficulty in moving the plug 12 relative to the crucible body 11 unless the plug 12 makes too tight an engagement with the crucible body 11. Further, since boron nitride is not wet by the melt 15, the penetration of the melt 15 into the boundary between the plug 12 and the body 11 does not cause a serious problem unless the engagement of the plug 12 with the crucible body 11 is too loose.

The plug 12 carries a source compound chip 14 of a compound semiconductor material in contact with the melt 15 in the crucible 10. This source compound chip 14 may be a single crystal or polycrystal chip of GaAs when the compound semiconductor crystal to be grown from the melt 15 is InGaAs. The chip 14 is embedded in a side wall part 12a of the bottom plug 12 as shown in FIG. 5(B). In the illustrated example, a pair of such source compound chips 14 are provided so as to surround the melt 15 at the bottom part of the crucible 10 from a pair of opposing directions. Further, there is provided a shutter part 11a at the bottom of the crucible body 11 in continuation with the funnel-shaped bottom part W. This shutter part 11a covers the chip 14 carried by the side wall 12a of the bottom plug 12 when the bottom plug 12 is rotated to a first rotational position shown in FIG. 5(C) by the motor 19. In this position, the chip 14 is isolated from the melt 15. When the bottom plug 12 is rotated relative to the crucible body 11 in the clockwise or counterclockwise direction by 90 degrees as illustrated in FIG. 5(D), on the other hand, the chip 14 is exposed and makes contact with the melt 15 in the space 10b.

Next, the operation of the apparatus of FIG. 5(A) will be described for a case of growing an InGaAs bulk crystal having a composition of $In_{0.53}Ga_{0.47}As$ which is a typical ternary compound semiconductor crystal. As already described, a polycrystal or single crystal of GaAs is used for the chip 14 when growing the InGaAs ternary crystal.

In operation, a melt having a composition of $In_{0.738}Ga_{0.005}As_{0.212}$ is loaded in the crucible 10 as the melt 15. In this loading procedure, the shutter 11a for isolating the chip 14 is in the state shown in FIG. 5(C) and the chip 14 is isolated from the melt 15. Further, the rod 18 is in a pulled up position in which the rod makes no contact with the melt 15 during the loading procedure of the melt 15. Then, the crucible 10 is heated up to a temperature of 860° C. together with the melt. Next, the melt 15 is cooled to a temperature of 840° C. At 840° C., the rod 18 is adjusted by the mechanism 18a such that the seed crystal 17 makes contact with the melt 15. Further, the bottom plug 12 is rotated to the state shown in FIG. 5(D) such that the source compound chip 14 makes contact with the melt 15. Then, the melt 15 is cooled to a temperature of 800° C. At the same time, a d.c. voltage source 20 is connected across the carbon electrode 16 and the carbon rod 13 via a regulator 20a such that the plus terminal of the d.c. voltage source 20 is connected to the electrode 16 and the minus terminal of the d.c. voltage source 20 is connected to the carbon rod or electrode 13 as illustrated in FIG. 5(A). Responsive thereto, an electrical current C flows through the melt 15 from the electrode 16 to the carbon rod 13. By adjusting the regulator 20a connected in series to the voltage source 20, a current density of about 20-30 A/cm$^2$ is established in the melt 15. It should be noted that the current C does not pass through any of the seed crystal 17 or the chip 14. Further, it should be noted that the source compound chip 14 is provided so as to surround the path of the current C as the chip 14 is provided at an intermediate position between the electrode 16 and the carbon rod 13.

Responsive to the current C, the electrons flow through the melt 15 from the carbon rod 13 to the electrode 16. Such electrons exchange the momentum with the species in the melt 15. As a result, there appears the electromigration in which relatively light species such as Ga and As are transported towards the upper part of the melt 15 where the melt makes contact with the seed crystal 17. Thus, there is a concentration of Ga and As in the upper part of the melt 15 surrounding the seed crystal 17 which leads to supersaturation of these species while there appears a depletion of these species in the lower part of the melt 15 surrounded by the chip 14. Thus, an InGaAs crystal 17a is grown on the seed crystal 17 epitaxially. Further, there appears a gradient of chemical potential in the aforementioned upper part of the melt 15 surrounded by the source compound chip 14 which facilitates the dissolution of Ga and As into the melt 15 from the chip 14. With increased current density, the transportation of Ga and As is increased and the degree of supersaturation of the melt 15 surrounding the seed crystal 15 is increased. Thus, one can increase the rate of the growth of the crystal by controlling the current C. With decreased current density, on the other hand, the degree of supersaturation of the melt 15 is decreased and the rate of the growth of the crystal is decreased. It should be noted that the passage of the current C does not cause heating or cooling of the seed crystal 17 or the source compound chip 14 in contact with the melt 15 as the current C does not pass through any of these parts. Thus, the undesirable influence to the growth of the crystal or to the composition of the melt due to the uncontrolled heating or cooling of the seed crystal 17 or the chip 14 which causes the fluctuation of the composition of the obtained InGaAs crystal is successfully eliminated. By pulling up the rod 18, one can continuously grow the crystal 17a and an ingot of the InGaAs crystal 17a is obtained.

Figure 6:
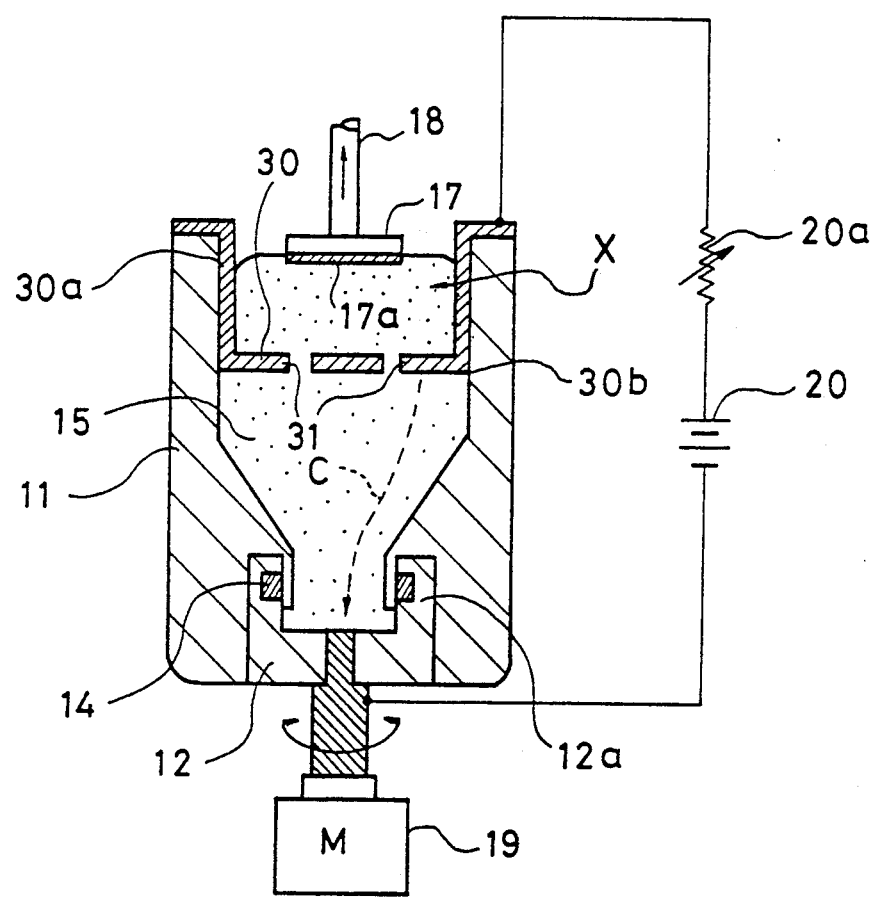
FIGS. 6 is a diagram showing a second embodiment of the apparatus of the present invention.

Next, a second embodiment of the apparatus of the present invention will be described with reference to FIG. 6. In FIG. 6, those parts constructed identically to those corresponding parts are given identical reference numerals and the description thereof will be omitted.

Referring to FIG. 6, there is provided a convection eliminating structure 30 for eliminating convective movement of the melt 15 in the vicinity of the crystal 17a. The structure 30 is made of carbon and encloses a relatively shallow region X in the vicinity of the crystal 17a. More specifically, the structure 30 comprises a sleeve part 30a extending along the inner wall of the crucible body 11 and a bottom wall 30b closing the bottom of the sleeve part 30a. Further, there are one or a plurality of holes 31 for allowing entrance of the melt 15 into the region X at the bottom wall 30b. The depth of the bottom wall 30b measured from the surface of the melt 15 is chosen such that there is substantially no convention of the melt 15 in the region X enclosed by the structure 30. According to the present embodiment, the convective movement of the melt 15 in the vicinity of the growing crystal 17a which is harmful in maintaining the melt composition at the desired composition is blocked by the structure 30 and the control of the composition of the crystal 17a can be performed more precisely by the control of the current C. In other words, the control of the current C by the regulator 20a becomes easier and the precision of the control is improved as compared to the case of the first embodiment. It should be noted that, in this embodiment, the structure 30 is connected to the plus terminal of the voltage source 20 and plays the role of the electrode 16 of the first embodiment. However, it is of course possible to provide the electrode 16 as in the case of the apparatus of FIG. 5(A) and connect the electrode 16 to the voltage source 20.

In the apparatus of FIG. 6, the bottom plug 12 is slightly modified such that the source compound chip 14 is embedded in the side wall 12a at an intermediate part. In other words, the chip 14 is not flush with the top surface of the side wall 12a which is in contact with the crucible body 11. As a result of such a configuration, the penetration of the melt 15 to the boundary 11b between the crucible body 11 and the plug 12 responsive to erosion of the chip 14 is avoided and the leakage of the melt 15 along such a boundary is prevented with increased reliability.

Figure 7A:
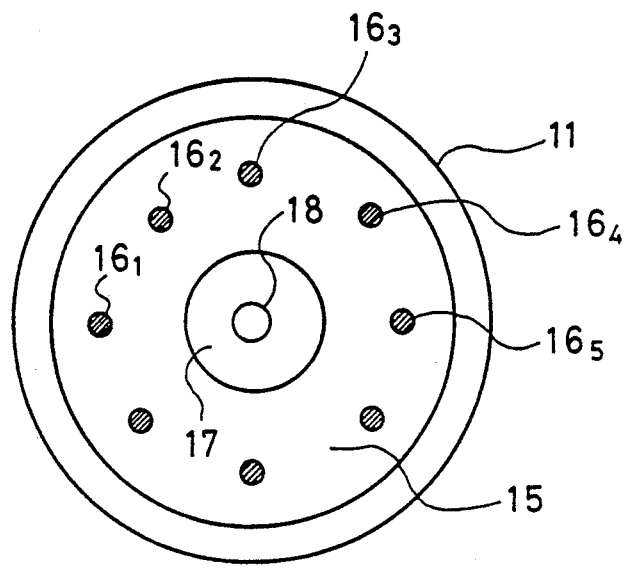
FIGS. 7(A) and (B) are diagrams showing various electrode structures used in the apparatus of the first and second embodiments.
Figure 7B:
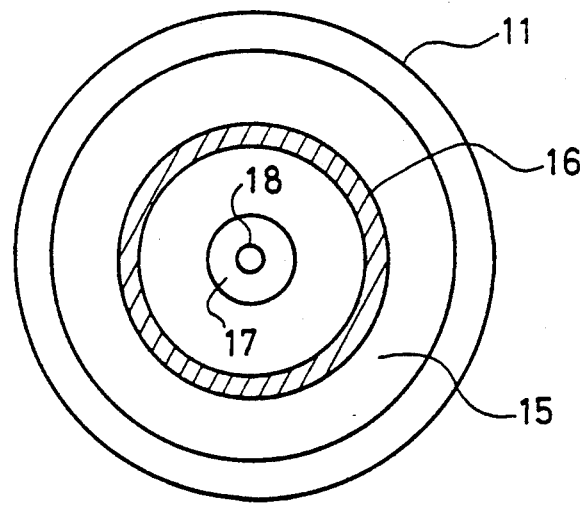

FIGS. 7(A) and (B) show modifications of the electrode 16 used in the embodiment of FIG. 5(A). In the modification of FIG. 7(A), the electrode 16 is constructed by a number of carbon rods $16_1$, $16_2$, . . . arranged symmetrically about the seed crystal 17. According to this construction, the transport of Ga and As to the vicinity of the seed crystal 17 is made more uniformly and improves the elimination of the compositional fluctuation of the obtained crystal 17a. The construction of FIG. 7(B) in which the seed crystal 17 is surrounded by a carbon sleeve forming the electrode 16 provides a similar effect. According to this construction, one can avoid the complexity of using a number of carbon rods while obtaining a uniform enrichment of Ga and As in the part of the melt 15 surrounding the crystal 17a grown on the seed 17.

Figure 8:
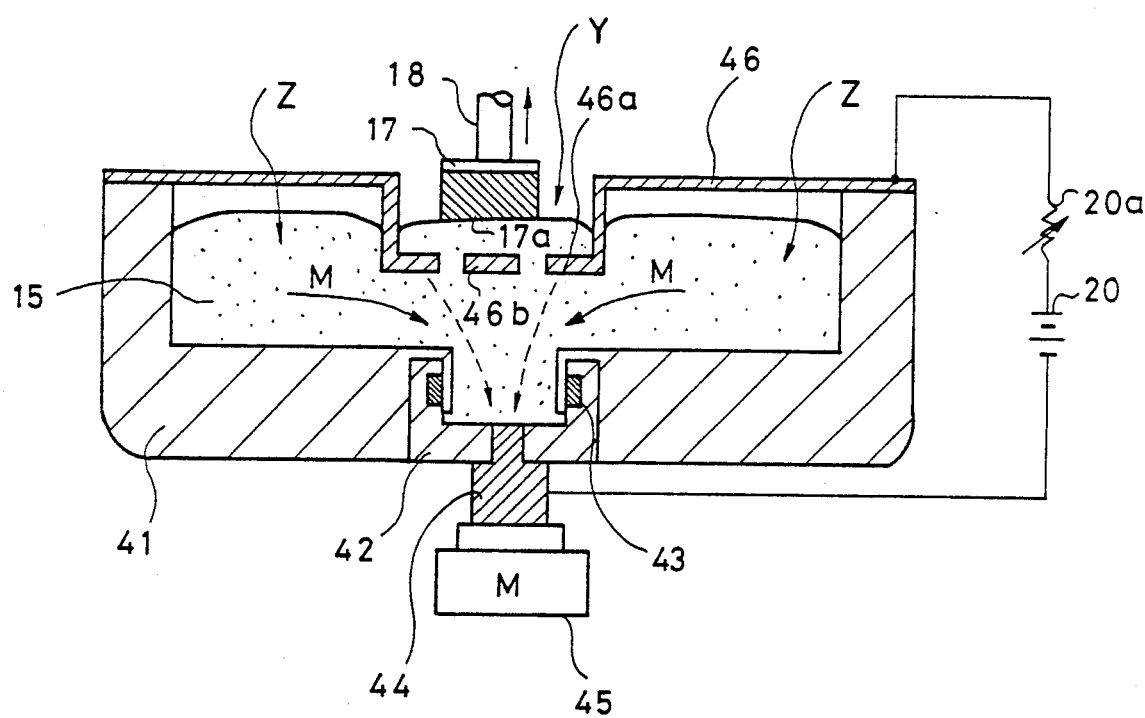
FIG. 8 is a diagram showing a third embodiment of the apparatus of the present invention.

FIG. 8 shows a third embodiment of the apparatus of the present invention. In the drawing, these parts constructed identically to those corresponding parts in the preceding drawings are given identical reference numerals and the description thereof will be omitted.

Referring to the drawing, the apparatus comprises a flat circular crucible body 41 made of boron nitride and a bottom plug 42 closing the bottom of the crucible body 41. The plug 42 carries the source compound chip 43 similarly to the embodiment shown in FIG. 6. The bottom plug 42 is provided with a carbon rod 44 acting as an electrode. Similarly to the case of the previous embodiments, the carbon rod 44 also acts as an operating rod for moving the bottom plug by being connected to a motor 45. Further, there is provided a convection eliminating structure 46 which may be a carbon plate provided with a depressed part 46a. The structure 46 covers the top of the crucible 41 and the depressed part 46a is dipped into the melt 15 in correspondence to the seed crystal 17 at the tip of the rod 18. As the depressed part 46a is formed with a number of holes 46b for allowing entrance of the melt into a region Y defined above the depressed part 46a, the melt 15 enters the region Y and makes contact with the seed crystal 17. Further, the structure 46 acting as the electrode is connected to the plus terminal of the voltage source 20 via the regulator 20a and the growth of the InGaAs crystal 17a is made similarly to the case of the previous embodiments.

In this embodiment, there is defined another region Z at a region radially outside of the region Y. This region Z occupies a volume which is much larger than the volume of the region Y which surrounds the crystal 17a and acts as a reservoir of the melt 15. Thus, as the crystal 17a is grown and the level of the melt 15 in the region Y is lowered, a fresh supply of the melt 15 is made as indicated by an arrow M. Thus, the present embodiment enables a continuous growth of the crystal 17a for a prolonged period of time by pulling up the rod 18. In other words, the apparatus of this embodiment is suited for fabrication of the InGaAs crystal 17a in the form of an ingot.

Further, the present invention is not limited to these embodiments but various variations and modifications may be made without departing from the scope of the invention.

What is claimed is:

1. An apparatus for growing a compound semiconductor crystal from a melt containing a plurality of component elements, said apparatus comprising:
   a crucible accommodating the melt;
   holding means for holding a seed crystal on which said compound semiconductor crystal is epitaxially grown such that the seed crystal makes contact with the melt;
   first electrode means provided in contact with the melt in the vicinity of the said seed crystal such that the seed crystal is separated from the first electrode means by the melt;
   second electrode means provided in contact with the melt such that the second electrode means is separated from said first electrode by the melt;
   current source means, connected across said first electrode means and said second electrode means, for providing a direct current from said first electrode means to said second electrode means along a current path extending through the melt from said first electrode means to said second electrode means; and
   a semiconductor piece of a semiconductor material including constituent elements which are included in said plurality of component elements forming the melt, said semiconductor piece provided in contact with the melt at a position separated from the first and second electrode means by the melt, said semiconductor piece releasing said constituent elements into the melt and said current source means transporting the released constituent elements toward the seed crystal by causing the direct current to flow.

2. An apparatus as claimed in claim 1 in which said semiconductor piece is provided so as to surround the current path extending through the melt from the first electrode means to the second electrode means.

3. An apparatus as claimed in claim 1 in which said elements contained in said semiconductor piece comprises at least one element which is depleted from the melt with the growth of the compound semiconductor crystal from the melt.

4. An apparatus as claimed in claim 1 further comprising an interrupting means for interrupting the contact between said semiconductor piece and the melt and an actuation means for actuating the interrupting means between a first state and a second state such that the semiconductor piece is contacted with the melt in the first state and is isolated from the melt in the second state.

5. An apparatus as claimed in claim 4 in which said first electrode means makes contact with a top surface of the melt, the second electrode means makes a contact with the melt at bottom of the crucible, and said semiconductor piece is held on a part of the crucible located between the first and second electrode means.

6. An apparatus as claimed in claim 5 in which said crucible comprises a crucible main body defined with a space for accommodating the melt and a bottom plug inserted into the crucible main body at the bottom of the crucible for confining the melt in said space, said bottom plug having a bottom wall part provided with a depression in continuation with said space in the crucible main body for receiving the melt and a side wall part surrounding said depression, said semiconductor piece being embedded in said side wall part such that at least a part of said semiconductor piece is exposed to the melt in the depression, and said second electrode means comprises a carbon rod inserted into the bottom wall part of the bottom plug so as to make contact with the melt in the depression in said bottom plug.

7. An apparatus as claimed in claim 6 in which a plurality of said semiconductor pieces are embedded in the side wall part so as to surround the melt in said depression of the bottom plug.

8. An apparatus as claimed in claim 6 in which said interrupting means comprises a shutter member extending from said crucible main body for covering the part of said semiconductor piece exposed to the melt and said actuation means comprises a motor connected to said carbon rod forming the second electrode means for rotating the bottom plug relative to the crucible main body together with the semiconductor piece between the first state and the second state.

9. An apparatus as claimed in claim 5 in which said first electrode means comprises a plurality of carbon rods arranged to surround the seed crystal.

10. An apparatus as claimed in claim 5 in which said first electrode means comprises a carbon sleeve extending along a holder rod means and surrounding the seed crystal.

11. An apparatus as claimed in claim 1 further comprising an enclosure dipped in the melt for defining a part of the melt which surround the seed crystal from the rest of the melt for preventing convective movement of the melt from being transmitted to the melt surrounded by the enclosure, said enclosure comprising a carbon body provided with one or a plurality of passage openings for allowing entrance of the melt to a vicinity of the seed crystal.

12. An apparatus as claimed in claim 1 further comprising means for pulling up the holding means.

* * * * *